US006737871B1

(12) United States Patent
Schneider et al.

(10) Patent No.: US 6,737,871 B1
(45) Date of Patent: May 18, 2004

(54) NON-INVASIVE CABLE TESTER

(75) Inventors: John M. Schneider, Hilliard, OH (US); James R. Booker, Baltimore, OH (US); Edward J. Koegler, Pickerington, OH (US); John D. Mandeville, Baltimore, OH (US)

(73) Assignee: American Electric Power Co., Inc., Columbus, OH (US)

( * ) Notice: Subject to any disclaimer, the term of this patent is extended or adjusted under 35 U.S.C. 154(b) by 0 days.

(21) Appl. No.: 10/352,289

(22) Filed: Jan. 27, 2003

Related U.S. Application Data

(63) Continuation of application No. 09/609,753, filed on Jul. 3, 2000, now Pat. No. 6,531,880.

(51) Int. Cl.[7] .......................... H04B 3/46; G01R 29/12; G01R 31/312; G01R 19/14
(52) U.S. Cl. ....................... 324/539; 324/457; 324/542; 324/133; 324/72.5
(58) Field of Search ................... 324/539, 542, 324/543, 545, 556, 72, 72.5, 126, 390, 457, 76.72, 76.14, 96, 133

(56) References Cited

U.S. PATENT DOCUMENTS

| | | | | |
|---|---|---|---|---|
| 3,774,110 A | * | 11/1973 | Roveti | 324/133 |
| 4,007,418 A | * | 2/1977 | Hanna | 324/72 |
| 4,349,782 A | * | 9/1982 | Doss | 324/390 |
| 4,503,389 A | * | 3/1985 | Singer | 324/133 |
| 4,520,318 A | * | 5/1985 | Hascal et al. | 324/457 |
| 5,473,244 A | * | 12/1995 | Libove et al. | 324/126 |
| 5,914,608 A | * | 6/1999 | Wissman et al. | 324/522 |
| 6,531,880 B1 | * | 3/2003 | Schneider et al. | 324/539 |

* cited by examiner

*Primary Examiner*—Anjan K. Deb
(74) *Attorney, Agent, or Firm*—Standley Law Group LLP

(57) ABSTRACT

The present invention is a non-invasive cable tester. The cable tester comprises a sensor for detecting an electric field emitted by a live electric cable. The resulting signal from the sensor is then filtered, amplified, and compared to a threshold value to determine the energization status of the electric cable. A meter can be provided to get a reading of the amplified signal that can be compared to a predetermined threshold value. Also, a detector circuit can be provided that includes a comparator in electrical communication with a light-emitting device such as a light-emitting diode. The detector circuit processes the amplified signal and compares it to a predetermined threshold value. If the electric cable is energized, the output of the comparator either causes the light-emitting device to emit light or not emit light, as desired. This enables an operator to determine the status of the electric cable simply by determining whether the light-emitting device is lit.

13 Claims, 5 Drawing Sheets

NON-INVASIVE CABLE TESTER

CROSS REFERENCE TO RELATED APPLICATIONS

This application is a continuation of U.S. application Ser. No. 09/609,753, filed Jul. 3, 2000, and now U.S. Pat. No. 6,531,880, which is expressly incorporated herein by reference.

BACKGROUND AND SUMMARY OF THE INVENTION

The present invention relates generally to the maintenance of electric cables and, more particularly, to a non-invasive device and method for detecting energization of electric conductors. The device is particularly useful for testing underground electric power distribution cables. However, it should be recognized that the device of the present invention may be used to test overhead electric power cables as well as other types of electric cables that produce a sufficient electric field when energized.

It is often necessary to determine the energization status of an electric cable prior to performing any maintenance. Failure to correctly determine whether an electric cable is live or dead can be dangerous and costly. At a minimum, the mistake can result in the need for additional repairs to the electric cable. At worst, the mistake presents a significant hazard to the safety of the maintenance workers. If the maintenance workers are operating under the mistaken belief that a live electric cable is dead, there is a considerable risk of physical injury or electrocution.

A power outage is one example of a situation that requires a determination of the energization status of an electric cable. The cause of a power outage may be a faulted cable. In that event, maintenance workers are typically called to the site to locate the dead cable. In many cases, the dead cable is surrounded by a plurality of live cables. If the cables are underground, a trench is typically dug to uncover the cables. Thereafter, different methods have been used for testing the energization status of the cables to identify the dead cable. However, these methods are either too time consuming, destructive, dangerous, or unreliable.

One common method is to pierce the cable with a spiked penetrator clamp. This requires piercing the cable insulation with at least one spike to make electrical contact with the internal conductor. In the event that the conductor is energized, a rather large electrical discharge results. The electrical discharge endangers anyone who is in the vicinity. Moreover, this testing method is destructive and unreliable. The damage caused by piercing the cable will have to be repaired, or the cable will have to be replaced. In addition, a false indication, i.e., no electrical discharge, occurs if the spike(s) do not make contact with the energized conductor.

Another method is to inject test signals into the electric cable. For example, probes are advanced into the cable to contact the screen layer and/or the shield of the cable. Test signals are then input and measurements are taken to determine the energization status of the cable. However, this method causes damage to the cable which must eventually be repaired, or the cable may have to be replaced. Furthermore, the method can be time consuming, and the test equipment can be expensive.

Still another method is to measure the magnetic field emanating from an electric cable. This method may not require the electric cable to be pierced. However, this method can be unreliable. A magnetic field sensor may lose sensitivity near the middle of the length of an energized electric cable. As a result, testing the energized electric cable at the middle of its length may result in a false negative reading. Additionally, the strength of a magnetic field is directly related to the amount of current flowing through the conductor, i.e., more current produces a stronger magnetic field. However, the voltage carried by the conductor can be very high even though the current flowing through the conductor is very low. As a result, a magnetic field sensor may also provide a false reading when testing a conductor carrying a high voltage if the current is low.

Measuring the surface temperature of an electric cable is another testing method that may not require the cable to be pierced. However, this method may also be unreliable. The cable temperature is proportional to load current. If the cable does not carry any load, its temperature would be roughly at ambient, yet it could still be energized. In addition, variations in the ambient temperature may lead to inaccurate readings. Moreover, these testing devices can be costly.

In light of the shortcomings of the foregoing testing methods and devices, a need exists for a testing method and device that provides accurate readings without the need to pierce the electric cable or to expose the internal conductor. Another need exists for a testing method and device that is safe and does not cause an electrical discharge when the electric cable is live. Still another need exists for a testing method and device that does not require signals to be injected into the electric cable. There is also a need for a testing method and device that does not require expensive testing equipment. In addition, a need exists for a testing method and device that is accurate over the entire length of the electric cable. Finally, a need exists for a testing method and device that is dependent on the voltage, as opposed to the current, carried by the conductor.

The present invention satisfies some or all of these needs. One embodiment of the present invention is a device for detecting energization of an electric conductor. The electric conductor may be an internal part of an insulated electric cable having an outer jacket, e.g., a URD cable. The device includes a sensor for detecting an electric field produced by the electric conductor when it is energized. The sensor is adapted to produce a signal in response to the electric field. An amplifier is in electrical communication with the sensor, and it is adapted to amplify the signal a desired amount. A detector circuit comprising at least one comparator is in electrical communication with the amplifier. The detector circuit is adapted to compare an output of the amplifier to a threshold value to determine if the electric conductor is energized. For example, the threshold value may be in the range of from about 0.5 to about 5 volts.

In an optional embodiment of the present invention, the sensor is adapted to extend substantially around the electric conductor or, in the case of an electric cable having an outer jacket, the outer jacket. The sensor may be a capacitor comprising a first plate, a second plate, and a dielectric connecting the first plate and the second plate. If the electric conductor is not enclosed by an outer jacket, the sensor can detect the electric field when the first plate is placed sufficiently near the electric conductor and the second plate is grounded. Similarly, when the electric conductor is substantially enclosed by an outer jacket, the sensor can detect the electric field when the first plate is placed sufficiently near or substantially against the outer jacket and the second plate is grounded.

Optionally, the sensor further comprises a second dielectric connected to the first plate such that the first plate is positioned between the first dielectric and the second dielectric. In such an embodiment, the sensor is adapted to detect the electric field when the second dielectric is placed sufficiently near or substantially against the electric conductor or, in the case of an electric cable having an outer jacket, the outer jacket. In addition, the sensor may also comprise a shield and a third dielectric, wherein the third dielectric connects the shield to the second plate.

As is known in the art, the gain of the amplifier may be comprised of a plurality of amplification stages. The gain of the amplifier is preferably adjustable. An adjustable gain preferably enables the same device to be used to test conductors carrying different voltages. In one example, the amplifier has a gain of up to about 80 decibels (dB). Nevertheless, it is appreciated that the amplifier may have a gain greater than about 80 dB.

The detector circuit may include at least one light-emitting device, e.g., a light-emitting diode, in electrical communication with a comparator to indicate the status of the electric conductor. For example, the detector circuit may include one comparator in electrical communication with a light-emitting device such that the light-emitting device emits light when the electric conductor is energized. In addition, the detector circuit may include a second comparator in electrical communication with a second light-emitting device such that the second light-emitting device emits light when the electric conductor is not energized.

The device preferably includes at least one filter before the amplifier and/or interposed between amplification stages and/or interposed between the amplifier and the detector circuit. At least one filter is preferably adapted to filter the signal to improve the performance of the device. The type of filter may be selected based on the frequency of the signal that will be carried by the electric conductor when it is energized. For example, the filter may be a 60 Hz bandpass filter if the electric conductor is intended to transmit a 60 Hz power signal. For another example, the filter may be a 50 Hz bandpass filter if the electric conductor is intended to transmit a 50 Hz power signal.

The sensor may purposefully or inadvertently sense an excessive signal. Accordingly, the device may also include a voltage or current surge protection circuit in electrical communication with the amplifier. The surge protection circuit is preferably adapted to protect the amplifier and the detector circuit from signals that exceed a predetermined voltage or current level.

The device may include an insulated handle connected to the sensor. The insulated handle preferably enables an operator to place the sensor in position to measure the electric field. An example of an insulated handle is a commercially available hotstick.

Another embodiment of the present invention is a system for detecting energization of an electric cable. The system may include any of the optional or preferred features of the above-described device of the present invention. The system includes an electric cable that is adapted to produce an electric field when energized. The electric cable comprises an electric conductor. The system also includes a sensor adapted to produce a signal in response to the electric field. The sensor comprises a first plate, a second plate, and a dielectric connecting the first plate and the second plate. The first plate substantially abuts the electric cable, and the second plate is connected to ground. An amplifier is in electrical communication with the sensor. The amplifier is adapted to amplify the signal a desired amount. A detector circuit is in electrical communication with the amplifier. The detector circuit includes at least one comparator and at least one light-emitting device. The detector circuit is adapted to compare an output of the amplifier to a threshold value to determine if the electric conductor is energized. The at least one light-emitting device is in electrical communication with the at least one comparator, and it is adapted to indicate the status of the electric conductor.

The present invention also includes a method for detecting energization of an electric cable. The method begins by providing an electric conductor adapted to produce an electric field when energized. Also provided is a sensor adapted to detect the electric field. The sensor is further adapted to produce a signal in response to the electric field. The sensor detects the electric field, and the signal is processed to determine whether the electric conductor is energized.

The method may include any of the optional or preferred features of the aforementioned embodiments of the present invention. The processing may be performed with any circuitry including, but not limited to, analog circuitry, digital circuitry, digital signal processing circuitry, software, other suitable, conventional, or similar types of electronic circuitry, and combinations of any of these types of circuitry. During processing, the signal may be amplified a desired amount. In addition, the processing step may include filtering the signal. For example, the signal may be filtered at least before each amplification stage.

Processing may also include comparing the signal to a threshold value to determine the energization status of the electric conductor. The comparison may occur after the signal is adequately amplified and filtered. One example of the comparison step includes providing the signal to a meter having a display such that an operator can compare the reading of the display to a threshold value. Another example of the comparison step includes causing a light-emitting device to emit light if the signal exceeds a threshold value. Moreover, it may further include causing a second light-emitting device to emit light if the signal does not exceed a threshold value. In this or a similar manner, the light-emitting device(s), e.g., light-emitting diode(s), can provide a visual indication of the status of the internal electric conductor.

In addition to the novel features and advantages mentioned above, other objects and advantages of the present invention will be readily apparent from the following descriptions of the drawings and preferred embodiments.

DETAILED DESCRIPTION OF PREFERRED EMBODIMENT(S)

The present invention is directed to a non-invasive cable tester. In other words, a preferred device of the present invention does not cause any physical damage to the electric cable. A preferred embodiment of the device may be used to test the energization status of generally any electric cable, conductor, or wire that is adapted to produce an electric field when energized. For example, the device can be used to test the status of 5-kilovolt to 35-kilovolt URD cables.

Figure 1:
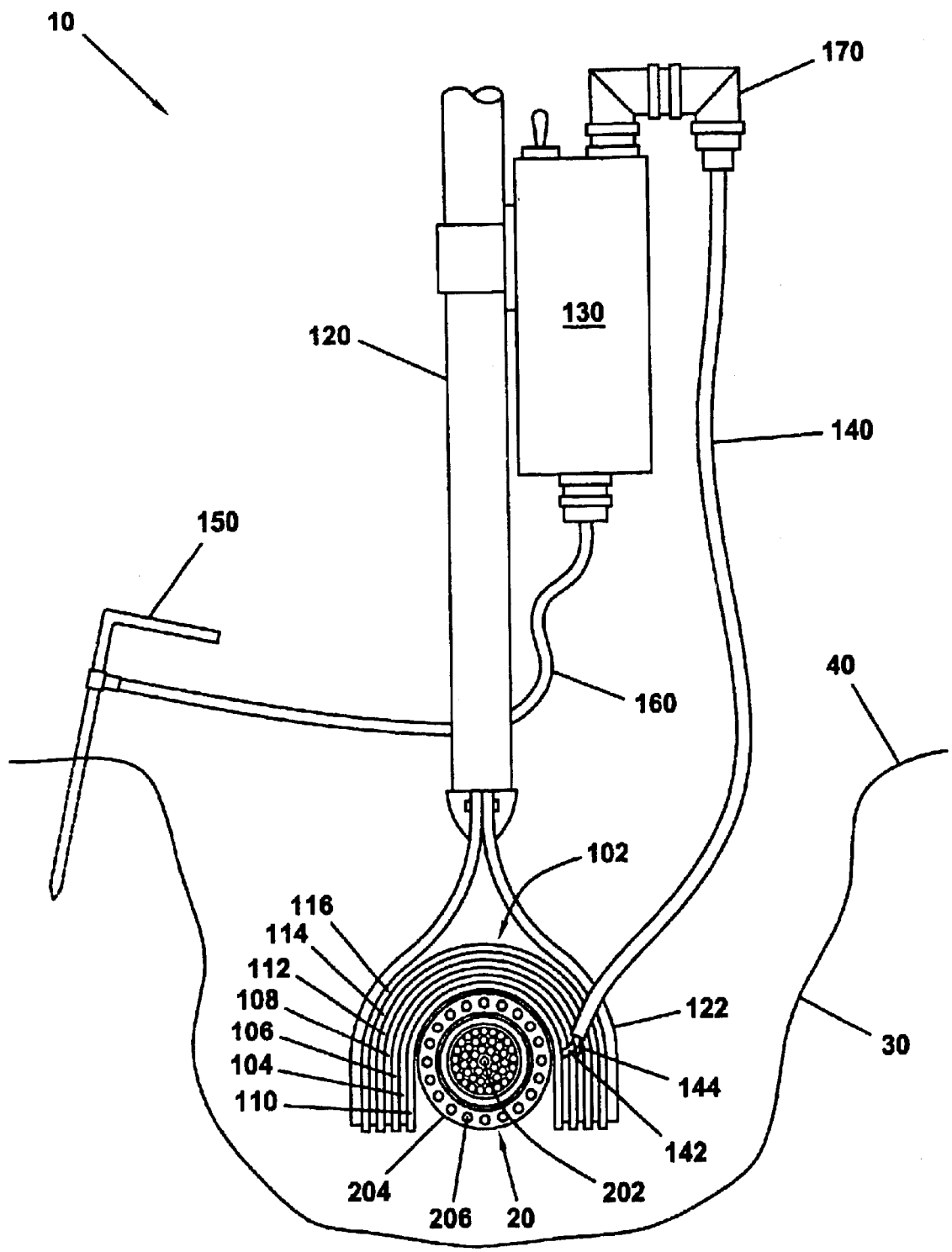
FIG. 1 is a side elevation view of one embodiment of a non-invasive cable-testing device of the present invention.

FIG. 1 illustrates a preferred embodiment of the cable tester 10 of the present invention in position to test the energization status of a URD cable 20. A trench 30 has been dug in the ground 40 to expose the URD cable 20 for testing. The URD cable 20 comprises an electric conductor 202. The electric conductor 202 is enclosed by an outer jacket 204. In a conventional URD cable 20, the outer jacket 204 is typically a suitable plastic layer, e.g., a polyvinyl chloride (PVC) or polyethylene layer. A plurality of shield wires 206 are covered by the outer jacket 204. When the URD cable 20 is energized, an electric field is produced by the electric conductor 202. The electric field passes between the shield wires 206 and into the surrounding environment.

The cable tester 10 is adapted to sense the electric field produced by the electric cable 20. For this purpose, the cable tester 10 includes a sensor 102. The sensor 102 may be a capacitor or another similar, suitable, or conventional device. However, it should be recognized that the sensor 102 may be any device that is adapted to produce a signal in response to an electric field.

In this embodiment, the sensor 102 is comprised of a first plate 104, a dielectric 106, and a second plate 108 for sensing the electric field. The dielectric 106 connects the first plate 104 to the second plate 108. The sensor 102 may also include an optional dielectric 110 and an optional dielectric 112. Dielectrics 110 and 112 preferably prevent respective plates 104 and 108 from making direct electrical contact with a live electric conductor. Dielectrics 110 and 112 also preferably serve to protect respective plates 104 and 108 from physical damage, dirt, corrosion, and other harm. Additionally, the sensor 102 may include an optional shield 114. The shield 114 may be connected to ground by any suitable method. For example, the shield 114 may be in electrical communication with ground via an electric cable. The shield 114 preferably shields the first plate 104 and the second plate 108 from electric fields that are not produced by the URD cable 20 in order to improve the accuracy of the testing system. For this reason, the shield 114 may be particularly useful when the URD cable 20 is surrounded by other live electric cables. An optional dielectric 116 may be positioned on the outer surface of the shield 114. The dielectric 116 preferably prevents shield 114 from making direct electrical contact with a live electric conductor, and it also preferably protects shield 114 from physical damage, dirt, corrosion, and the other harm.

Figure 2:
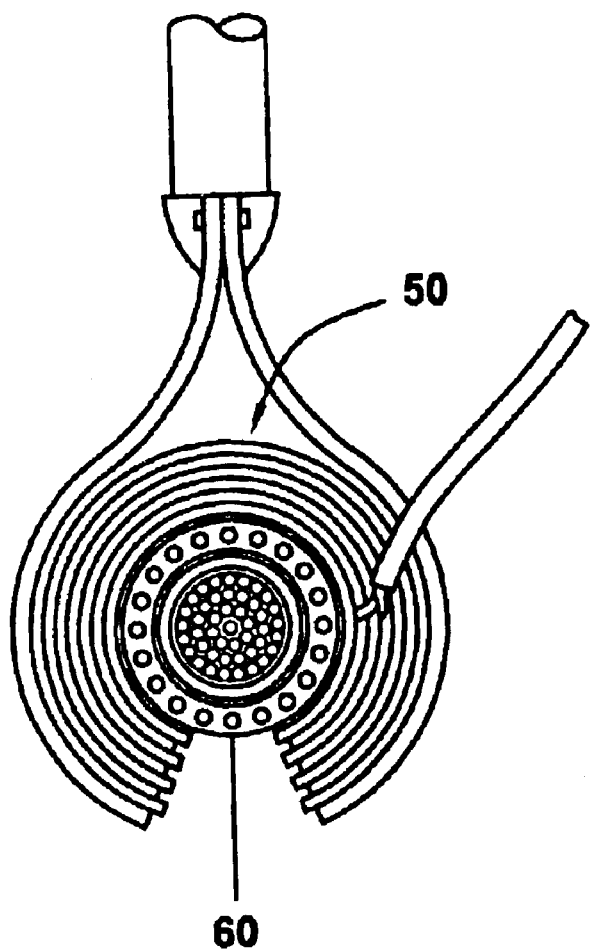
FIG. 2 is a side elevation view of one embodiment of a sensor of the present invention that is adapted to extend substantially around an electric cable.

The electric field intensity decreases with increasing distance from the URD cable 20. Accordingly, for the most accurate testing, it is preferred that the sensor 102 is shaped such that: (1) the first plate 104 can be positioned as near as possible to the outermost surface of the URD cable 20; and (2) the first plate 104 can be positioned around as much of the outermost surface of the URD cable 20 as possible. In the example of FIG. 1, the sensor 102 is U-shaped such that the innermost surface of the sensor 102 can be substantially abutted against the URD cable 20. FIG. 2 shows another example of a sensor 50 that is adapted to substantially abut and extend substantially around a URD cable 60. However, it should be recognized that the sensor may have any size and shape which enables it to sense an electric field produced by the electric cable. It should also be recognized that the size and shape of the sensor may be adjustable for optimal testing of different sizes of electric cables.

The first plate 104, the second plate 108, and the shield 114 are each preferably made from a good electrical conductor, e.g., copper, brass, aluminum, or other suitable metals or alloys. On the other hand, dielectrics 106, 110, 112, and 116 may be any electrical insulator(s) having sufficient ability to withstand the electrical stress of the intended use. For example, each of the dielectrics 106, 110, 112, and 116 may be a commercially available safety protection material such as, but not limited to, a 7,200-volt safety protection material. However, it should be recognized that suitable dielectrics may also include wood, paper, glass, various rubbers and plastics, and other materials having similar or suitable insulating properties. In addition, it should be recognized that dry, pure air and distilled water may also be suitable dielectrics.

The various layers of the sensor 102 may be connected together by any suitable means. For instance, adjacent layers may be connected by mechanical means such as, but not limited to, screws, bolts, nails, clamps, clips, or other suitable, similar, or conventional mechanical fastening means. Also, adjacent layers may be connected by a suitable adhesive such as an epoxy or any other suitable, similar, or conventional adhesive. For example, the adjacent layers may be connected together by a commercially available adhesive that is suitable for outdoor electrical applications.

The sensor 102 is connected to an insulated handle 120 by joint 122. The insulated handle 120 preferably enables an operator to safely put the cable tester 10 in position to test the URD cable 20. The insulated handle 120 may be any suitable item such as, but not limited to, a commercially available hotstick or any other similar or conventional item. It should be recognized that the insulated handle 120 may have any desired shape, and it may be made from any insulating material having the desired ability to withstand electrical stress.

The sensor 102 is also connected to the signal processing chassis 130 by electric cable 140. The signal processing chassis 130 may be mounted on the insulated handle 120. It is also preferred that the signal processing chassis 130 is grounded. In this example, the cable tester 10 includes a ground stake 150. As shown in FIG. 1, the ground stake 150 is adapted to be inserted into the ground 40 at the testing site. The ground stake 150 is in electrical communication with the signal processing chassis 130 via electric cable 160. As a result, the signal processing chassis 130 is grounded.

The signal processing chassis 130 houses the processing circuitry of the cable tester 10. The first plate 104 and the second plate 108 are in electrical communication with the processing circuitry via the electric cable 140. In this example, the electric cable 140 comprises a conductor 142 and a shield 144. However, it should be recognized that the electric cable 140 may be any cable(s), wires, and/or conductors that can connect the first plate 104 and the second plate 108 to the processing circuitry. The conductor 142 may be placed in electrical communication with the first plate 104 by any conventional means including, but not limited to, soldering, crimping, electrical tape, a suitable adhesive such as the one described above, or any other similar or suitable means. Likewise, the shield 144 may be placed in electrical communication with the second plate 108 by any conventional means. The shield 144 is also in electrical communication with ground 40 via the signal processing chassis 130 and the connector 170.

In order to sense an electric field produced by a live URD cable 20, the dielectric 110 is abutted against or positioned sufficiently near the outer jacket 204 of the URD cable 20.

For optimum testing, the first plate 104 is positioned as close as possible to the URD cable 20. Nevertheless, it should be recognized that if the electric field is sufficiently intense, the first plate 104 can be positioned further away from the URD cable 20.

Figure 5:
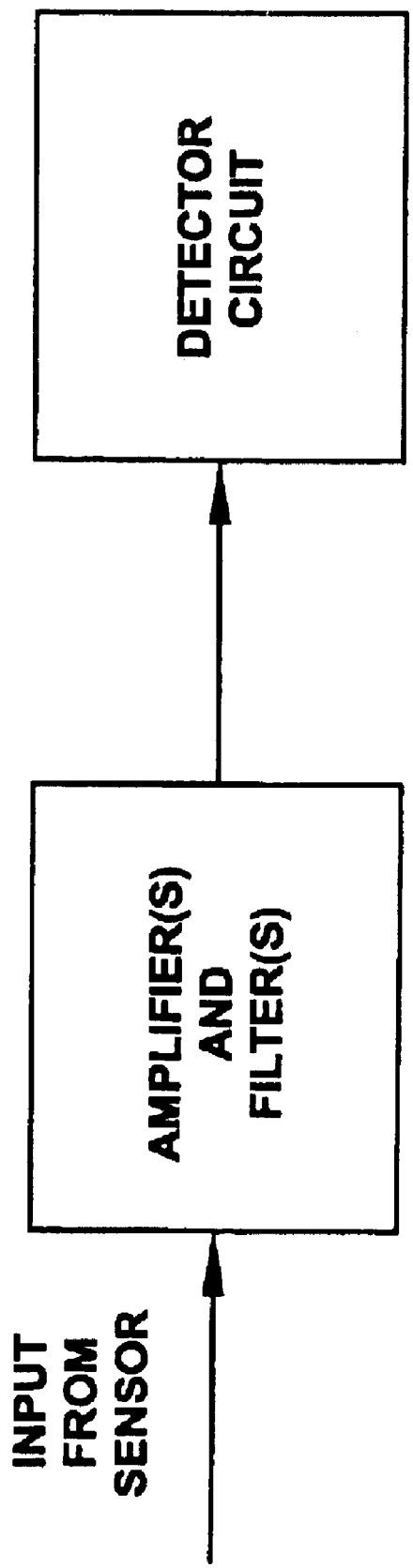
FIG. 5 is a block diagram of one embodiment of the processing circuitry of the present invention.

With the sensor 102 in adequate testing position, a potential difference develops between the first plate 104 and the second plate 108 when an electric field is sensed. The resulting signal is supplied to the processing circuitry by the electric cable 140. FIG. 5 is a block diagram of one embodiment of the processing circuitry. In the example of FIG. 5, the signal from the sensor is provided to an amplifier and optionally to at least one filter. The signal is then provided to a detector circuit to determine whether the electric conductor is energized.

Figure 3:
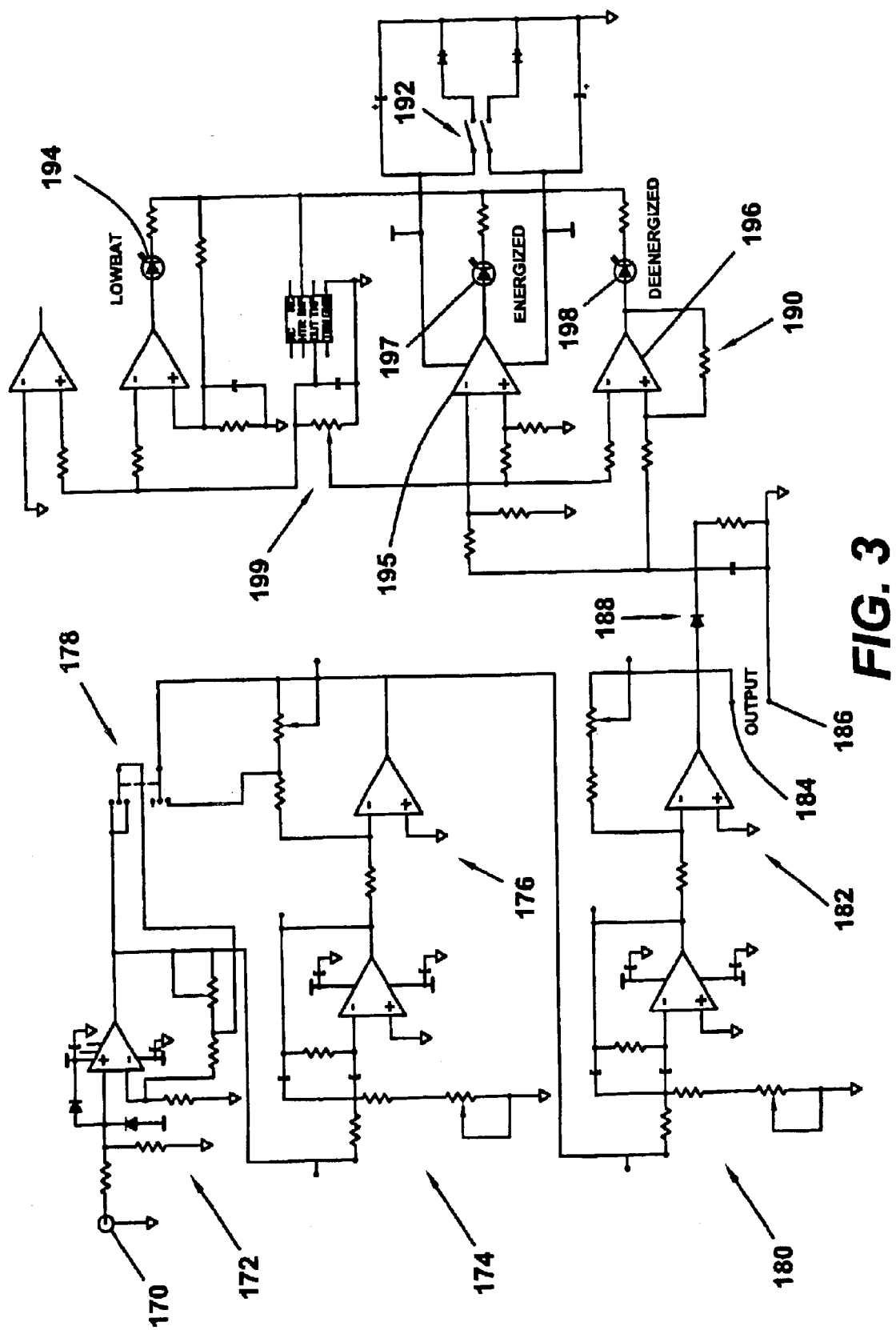
FIG. 3 is a diagram of one embodiment of the processing circuitry of the present invention.
Figure 4:
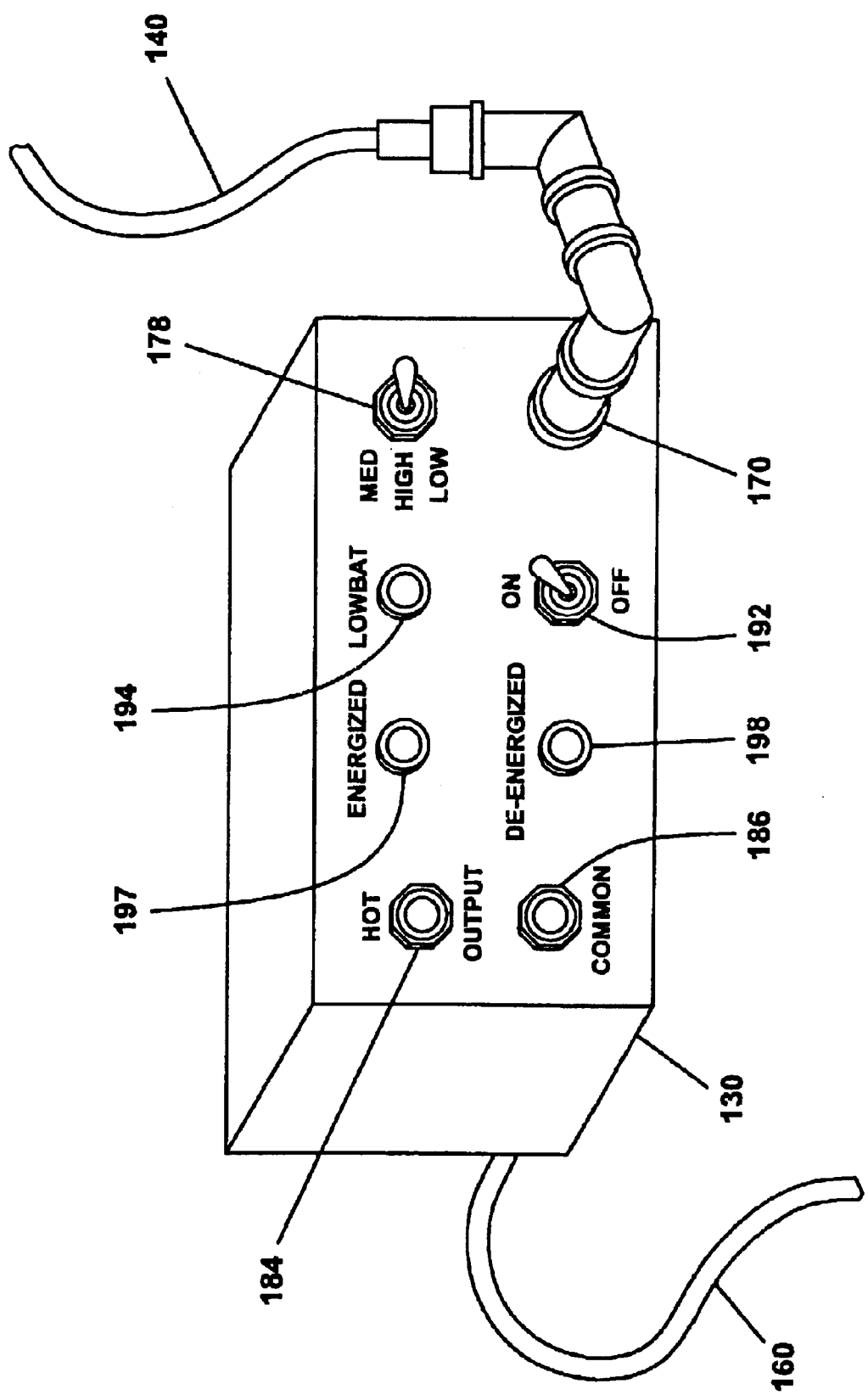
FIG. 4 is a perspective view of one embodiment of a signal processing chassis of the present invention.

FIG. 3 shows a circuit diagram of one embodiment of the processing circuitry, and FIG. 4 shows one embodiment of the signal processing chassis 130. The signal from the sensor 102 is input to the processing circuitry at connector 170. Optionally, the signal may be initially processed by a surge protection circuit 172. The output of the surge protection circuit 172 may then be filtered by filter 174. Amplification stage 176 amplifies the output of the filter 174. Optional switch 178 allows the adjustment of the gain of the amplification stage 176. This enables the processing circuitry to be adjusted to account for electric fields of varying strengths. The output of the amplification stage 176 is filtered by another filter 180. Thereafter, a second amplification stage 182 amplifies the output of the filter 180.

The output of the amplification stage 182 can optionally be checked at terminals 184 and 186 using a meter. This enables an operator to compare the reading of the meter with a predetermined threshold value to determine whether the URD cable 20 is energized. The threshold value may be any desired value. For instance, the threshold value may be in the range of from about 0.5 to about 5 volts. However, it should be recognized that the desired threshold value may also be less than about 0.5 volts or greater than about 5 volts. As an example, a reading greater than the threshold value could indicate that the URD cable 20 is energized, and a reading less than the threshold value could indicate that the URD cable 20 is not energized.

The output of the amplification stage 182 may be rectified by a rectifier 188. The output of the rectifier 188 is then provided to the detector circuit 190. Switch 192 is adapted to turn the detector circuit 190 on and off. Also, optional light-emitting device 194 provides a visual indication when the power supply of the detector circuit 190 is low.

The detector circuit 190 processes the output of the rectifier 188 to determine the status of the URD cable 20. In this embodiment, the detector circuit 190 includes a comparator 195 and a comparator 196. Comparators 195 and 196 may test based on any desired criteria including, but not limited to, amplitude, frequency, phase, voltage, current, waveform type, numerical value, or any other suitable criteria. An example of comparators 195 and 196 is the commercially available LM139JA or any other commercially available comparator. However, it should be recognized that each of the comparators 195 and 196 may be any electronic device,that can test a signal and provide an appropriate output signal. A light-emitting device 197 is in electrical communication with the comparator 195. Similarly, a light-emitting device 198 is in electrical communication with the comparator 196. Light-emitting devices 197 and 198 may be light-emitting diodes or any other suitable, conventional, or similar devices that can accept electrical energy and produce light. In this example, comparators 195 and 196 compare signals to threshold values to determine whether the URD cable 20 is live or dead. Optional potentiometer 199 allows the adjustment of the threshold values. If the URD cable 20 is energized, the output of the comparator 195 causes the light-emitting device 197 to emit light. Conversely, the output of the comparator 196 causes the light-emitting device 198 to emit light if the URD cable 20 is not energized. As a result, an operator can determine the energization status of the URD cable 20 by looking at light-emitting devices 197 and 198 on the signal processing chassis 130.

Several factors should be taken into account when determining the predetermined threshold value(s). The primary considerations are the anticipated intensity of the electric field if the electric cable is live, the strength of the signal produced by the sensor, the amount of amplification by the processing circuitry, and the criteria for testing by the comparator(s) or other circuitry. As a result, it should be recognized that the predetermined threshold value(s) may be different for different applications. Also, it is recommended that the predetermined threshold value(s) be set at an adequate level to lower the possibility of a false reading.

Many different designs of the processing circuitry and the signal processing chassis are possible to determine the status of the electric conductor. FIGS. 3 and 5 are just two examples of the processing circuitry, and FIG. 4 is just one example of a signal processing chassis. The processing circuitry may be implemented with circuitry including, but not limited to, analog circuitry, digital circuitry, digital signal processing circuitry, software, other suitable, similar, or conventional types of electronic circuitry, and combinations of any of these types of circuitry. In addition, the processing circuitry may be of any type and design that can process the signal produced by the sensor to determine if the electric conductor is energized.

The preferred embodiments herein disclosed are not intended to be exhaustive or to unnecessarily limit the scope of the invention. The preferred embodiments were chosen and described in order to explain the principles of the present invention so that others skilled in the art may practice the invention. Having shown and described preferred embodiments of the-present invention, those skilled in the art will realize that many variations and modifications may be made to affect the described invention. Many of those variations and modifications will provide the same result and fall within the spirit of the claimed invention. It is the intention, therefore, to limit the invention only as indicated by the scope of the claims.

What is claimed is:

1. A device for detection of the energization state of a high-voltage electric conductor, said device comprising:

a sensor adapted to produce a signal in response to detection of an electric field emanating from said conductor; said sensor comprising:

a capacitor;

a dielectric material for preventing direct contact of components of said capacitor with said conductor; and a means of preventing said sensor from detecting extraneous electric fields;

electronic circuitry for processing said signal, said electronic circuitry comprising:

an amplifier for amplifying at least one characteristic of said signal;

a predetermined threshold value selected as appropriate for an anticipated voltage, or range of voltages, to which said sensor could be exposed;

a detection means for determining a value of said signal and comparing said signal, after output from said amplifier, to said predetermined threshold value; and at least one indicator in electrical communication with said detection means for indicating the energization state of said conductor;

wherein said predetermined threshold value is selected from a range of threshold values that are based on an anticipated strength of said signal produced by exposing said sensor to an energized conductor of some voltage;

wherein the strength of said signal will vary in some relationship to differences in the intensity of said electric field surrounding an energized conductor; and wherein said detection means causes said at least one indicator to denote that said high-voltage electric conductor is energized only when the value of said signal is equal to or exceeds said predetermined threshold value.

2. The device of claim 1, wherein said dielectric material comprises multiple layers that both cover and separate plates of said capacitor.

3. The device of claim 1, wherein said predetermined threshold value is adjustable.

4. The device of claim 3, wherein said threshold value is adjustable between any of a plurality of threshold values falling within said range of threshold values.

5. The device of claim 3, wherein said predetermined threshold value can be adjusted by a user of said device.

6. The device of claim 1, wherein said range of threshold values is based on an expected range of conductor voltages to which said sensor will be exposed.

7. The device of claim 1, further comprising means for allowing a user of said device to adjust the gain of said amplifier.

8. A device for detection of the energization state of a high-voltage electric conductor, said device comprising:

a sensor adapted to produce a signal in response to detection of an electric field emanating from said conductor; said sensor comprising:

a capacitor;

a dielectric material for preventing direct contact of components of said capacitor with said conductor, said dielectric material comprising multiple layers that both cover and separate plates of said capacitor; and a means of preventing said sensor from detecting extraneous electric fields;

a signal adjustment means for manipulating at least one characteristic of said signal;

a detection means for comparing said signal, after output from said signal adjustment means, to a predetermined value; and at least one indicator in electrical communication with said detection means for indicating the energization state of said conductor;

wherein said energization state of said conductor can be accurately determined without the need to contact or encircle said conductor with said sensor.

9. The device of claim 8, wherein said signal adjustment means is an amplifier.

10. The device of claim 9, wherein the gain of said amplifier can be adjusted by a user of said device.

11. The device of claim 8, wherein said predetermined value is adjustable.

12. The device of claim 11, wherein said predetermined value is selected from a range of values.

13. The device of claim 12, wherein said range of values is based on an expected range of conductor voltages to which said sensor will be exposed.

* * * * *